United States Patent
Choi et al.

(10) Patent No.: US 8,422,292 B2
(45) Date of Patent: Apr. 16, 2013

(54) NONVOLATILE MEMORY DEVICE AND PROGRAM METHOD THEREOF

(75) Inventors: Yoon-Hee Choi, Hwaseong-si (KR); BoGeun Kim, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 167 days.

(21) Appl. No.: 13/100,134

(22) Filed: May 3, 2011

(65) Prior Publication Data
US 2011/0280083 A1    Nov. 17, 2011

(30) Foreign Application Priority Data
May 12, 2010    (KR) .................. 10-2010-0044556

(51) Int. Cl.
*G11C 11/34*    (2006.01)
(52) U.S. Cl.
USPC ............ 365/185.03; 365/185.17; 365/185.18; 365/185.22; 365/185.24; 365/185.29; 365/185.33
(58) Field of Classification Search ............ 365/185.03, 365/185.17, 185.18, 185.22, 185.24, 185.29, 365/185.33
See application file for complete search history.

(56) References Cited

U.S. PATENT DOCUMENTS

| | | | |
|---|---|---|---|
| 7,184,310 B2 * | 2/2007 | Vorraro et al. | 365/185.17 |
| 7,492,634 B2 * | 2/2009 | Li et al. | 365/185.03 |
| 7,525,838 B2 * | 4/2009 | Jung et al. | 365/185.03 |
| 7,564,718 B2 * | 7/2009 | Seidel et al. | 365/185.22 |
| 7,599,219 B2 * | 10/2009 | Kim et al. | 365/185.22 |
| 8,000,150 B2 * | 8/2011 | Seol et al. | 365/185.22 |
| 8,054,682 B2 * | 11/2011 | Kang et al. | 365/185.03 |
| 8,085,600 B2 * | 12/2011 | Kang | 365/185.22 |
| 2008/0316820 A1 | 12/2008 | Seol et al. | |
| 2009/0052243 A1 | 2/2009 | Park et al. | |
| 2009/0067254 A1 | 3/2009 | Won et al. | |

FOREIGN PATENT DOCUMENTS

| | | |
|---|---|---|
| JP | 2009-004078 A | 1/2009 |
| JP | 2009-070539 A | 4/2009 |
| KR | 10-2008-0112101 A | 12/2008 |
| KR | 10-2009-0019194 A | 2/2009 |
| KR | 10-2009-0026710 A | 3/2009 |

* cited by examiner

Primary Examiner — Trong Phan
(74) Attorney, Agent, or Firm — Volentine & Whitt, PLLC

(57) ABSTRACT

A nonvolatile memory device and a programming method thereof perform a programming verification step including a selective verification step and a sequential verification step. In the selective verification step, a data input/output (I/O) circuit selectively precharges a selected bit line according to a temporary programmed state of stored data. In the sequential verification step, the data I/O circuit selectively precharges each bit line according to the result of the previous selective verification step or a previous sequential verification step. According to the programming method, because a memory cell not requiring a programming verification step is not precharged in the programming verification step, an ON cell current does not flow therethrough. Accordingly, the current flowing through a common source line during verification can be reduced.

20 Claims, 12 Drawing Sheets

NONVOLATILE MEMORY DEVICE AND PROGRAM METHOD THEREOF

CROSS-REFERENCE TO RELATED APPLICATIONS

A claim of priority under 35 U.S.C. §119 is made to Korean Patent Application No. 10-2010-0044556, filed on May 12, 2010 in the Korean Intellectual Property Office, the contents of which are hereby incorporated herein by reference in their entirety.

BACKGROUND

The present disclosure herein relates to semiconductor memory devices, and more particularly, to a nonvolatile memory device capable of reducing the noise of a common source line, and a method of programming such a device.

In general, semiconductor memory devices may be classified into volatile memory devices and nonvolatile memory devices. The volatile memory devices lose data stored therein when power supply thereto is interrupted, whereas the nonvolatile memory devices retain data stored therein even when power supply thereto is interrupted. Examples of nonvolatile memory devices include flash memory devices, ferroelectric random-access memory (FRAM) devices, magnetic random-access memory (MRAM) devices, and phase-change random-access memory (PRAM) devices.

Flash memory devices are classified into NOR flash memory devices and NAND flash memory devices according to the types of cell array structure employed. A NOR flash memory device has a plurality of memory cell transistors connected respectively to bit lines and word lines. Thus, the NOR flash memory has good random-access time characteristics. On the other hand, a NAND flash memory device has a plurality of memory cell transistors connected in series with each other. This structure is called a cell string, and each cell string needs only one bit line contact. Thus, the NAND flash memory device has good characteristics in terms of the integration density.

A flash memory device includes a memory cell array that stores data. The memory cell array includes a plurality of memory blocks. Each of the memory blocks includes a plurality of pages. Each of the pages includes a plurality of memory cells. The memory cells are divided into ON cells and OFF cells according to the distribution of a threshold voltage for the cells. The ON cell is an erased cell and the OFF cell is a programmed cell. Due to its structural characteristics, the flash memory device performs an erase operation on a memory block basis and performs a read/write operation on a page basis.

The flash memory device has a cell string structure. The cell string includes a string select transistor (SST) connected to a string select line (SSL), memory cells connected to word lines (WLs), and a ground select transistor (GST) connected to a ground select line (GSL). The SST is connected to a bit line (BL), and the GST is connected to a common source line (CSL).

Meanwhile, if a noise voltage is generated on the CSL, the noise voltage of the CSL may cause a malfunction of the flash memory device. For example, although a memory cell that is intended to be programmed is not completely programmed (or written) yet during a programming operation, it may be incorrectly verified during a programming operation as having been programmed. In that case, if the memory cell is read after completion of the programming operation, such a malfunction may cause the memory cell that was intended to be programmed to be read as a non-programmed memory cell.

SUMMARY

The present disclosure provides a nonvolatile memory device capable of reducing the noise of a common source line, and a method of programming such a memory device.

In some embodiments of the inventive concept, a method is provided for programming a plurality of memory cells of a nonvolatile memory device to a plurality of target programmed states. The method comprises: performing a programming of at least some of the memory cells by applying a programming voltage; performing a selective verification for selecting memory cells to be programmed to a subset of the target programmed states, the subset being less than all of the target programmed states; and performing a sequential verification for determining programmed states of the selected memory cells by precharging bit lines of the selected memory cells.

In some embodiments, the selective verification step is performed before the sequential verification step.

In other embodiments, in the performing of the selective verification step, the bit lines of the memory cells to be programmed to the subset of the target programmed states are selectively precharged.

In further embodiments, the programming verification results of the precharged memory cells are determined according to the respective programmed states thereof.

In still further embodiments, the non-precharged memory cells are determined to be program-failed.

In still further embodiments, the sequential verification step is performed on each of the subset of the target programmed states.

In still further embodiments, the sequential verification step selectively precharges the memory cells according to the programming verification result of the selective verification step or a previous sequential verification step.

In still further embodiments, in the sequential verification step, a memory cell determined to be program-passed is selectively precharged.

In still further embodiments, in the sequential verification step, a ground voltage is applied to the bit line of a memory cell determined to be program-failed.

In still further embodiments, a sequential verification voltage applied in the performing of the sequential verification step is greater than a selective verification voltage applied in the performing of the selective verification step.

In still further embodiments, the programming voltage applied in the programming step is greater than the sequential verification voltage.

In still further embodiments, the programming step, the selective verification step and the sequential verification step constitute a program loop, and the program loop is repeated a predetermined, or fixed, number of times.

In still further embodiments, the programming voltage applied in the programming step increases by a predetermined, or fixed, increment whenever the program loop is repeated.

In still further embodiments, the target programmed state includes an erase state and a plurality of programmed states.

In still further embodiments, the programmed states are determined according to the number of data bits storable in the memory cell.

In other embodiments of the inventive concept, a nonvolatile memory device comprises: a plurality of memory cells connected respectively to a word line and bit lines and configured to be programmed to a plurality of target programmed states; a plurality of data input/output circuits connected respectively to the bit lines and configured to precharge the bit lines and to read data stored in the memory cells; and a control logic unit configured to apply a programming voltage to the word line and configured to control the data input/output circuits to perform a programming verification for determining programmed states of the memory cells, wherein the programming verification includes: a selective verification for selecting memory cells to be programmed to a subset of the target programmed states, the subset being less than all of the target programmed states; and a sequential verification for determining the programmed states of the selected memory cells by precharging bit lines of the selected memory cells.

In some embodiments, the control logic unit performs the selective verification step before the sequential verification step.

In other embodiments, in the selective verification step, the data input/output circuits precharge the respective bit lines of the memory cells to be programmed to the subset of the target programmed states.

In further embodiments, the sequential verification step is performed on the subset of the target programmed states, and in the sequential verification step, the data input/output circuits selectively precharge the respective bit lines according to the programming verification result of the selective verification step or a previous sequential verification step.

In still further embodiments, the data input/output circuits of the memory cells determined to be program-passed precharge the respective bit lines.

In other embodiments of the inventive concept, a method is provided for a nonvolatile memory device having a plurality of word lines, a plurality of bit lines, and a plurality memory cells each of which is connected to one of the word lines and one of the bit lines, wherein the memory cells are programmable to a plurality of target programmed states. The method comprises: supplying a programming voltage to a first one of the word lines having a set of the memory cells connected thereto; verifying a programmed state of the set of memory cells that are connected to the word line to which the programming voltage was applied, wherein the verifying comprises: performing a first selective verification for only selected memory cells, among the set of memory cells, which are to be programmed to a first subset of the target programmed states; and performing a sequential verification of only the selected memory cells for the subset of target programming states.

In some embodiments, the sequential verification comprises: performing a separate sequential verification sub-step for each of the target programming states in the subset, wherein each sequential verification sub-step is only performed on those memory cells among the selected memory cells that have not been determined to be program-failed in a previous sequential verification sub-step.

In some embodiments, verifying a programmed state of the set of memory cells that are connected to the word line to which the programming voltage was applied further comprises: performing a second selective verification for only second elected memory cells, among the set of memory cells, which are to be programmed to a second subset of the target programmed states; and performing a second sequential verification of only the second selected memory cells for the second subset of target programming states.

In some embodiments, the second sequential verification comprises: performing a separate second sequential verification sub-step for each of the target programming states in the second subset, wherein each second sequential verification sub-step is only performed on those memory cells among the second selected memory cells that have not been determined to be program-failed in a previous second sequential verification sub-step.

In some embodiments, supplying the programming voltage and verifying the programmed state comprise a program loop, and wherein the method comprises repeating the program loop a fixed number of times.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION OF THE EMBODIMENTS

Figure 1:
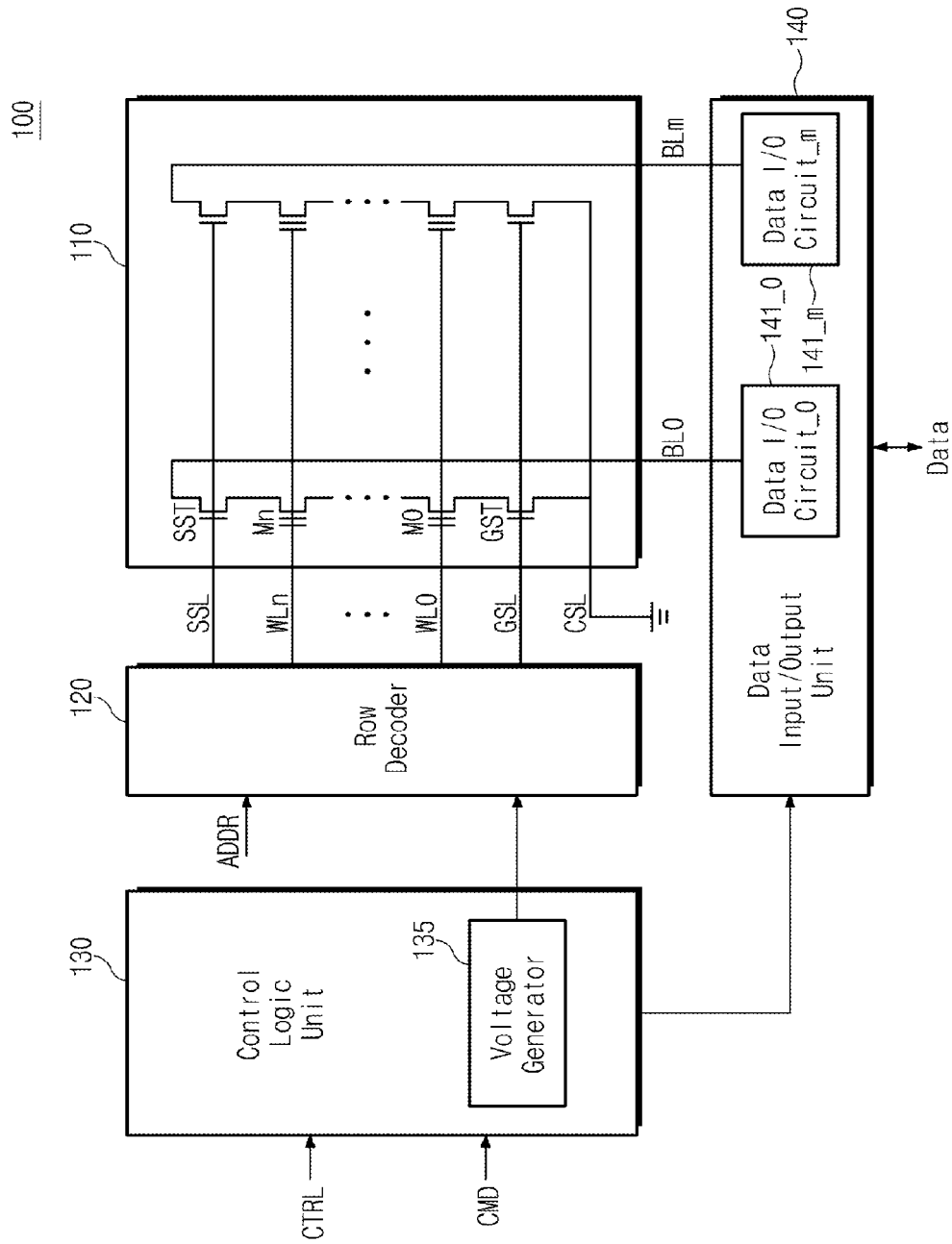
FIG. 1 is a block diagram illustrating a nonvolatile memory device according to an exemplary embodiment of the inventive concept.

Preferred embodiments of the inventive concept will be described below in more detail with reference to the accompanying drawings. Advantages and features of the inventive concept, and implementation methods thereof will be clarified through the following embodiments described with reference to the accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art.

In the drawings, exemplary embodiments of the inventive concept are exaggerated for clarity of illustration and are not limited to illustrated specific shapes. While specific terms are used in the specification, they are not used to limit the meaning or the scope of the inventive concept described in Claims, but merely used to explain the inventive concept.

As used herein, the term "and/or" includes any and all combinations of one or more of the associated listed items. Also, when one part (or element, device, etc.) is referred to as being "connected/coupled" to another part (or element, device, etc.), it should be understood that the former may be "directly connected" to the latter, or "indirectly connected" to the latter through at least one intervening part (or element, device, etc.). The terms of a singular form may include a plural form unless otherwise specified. Also, the meaning of "include", "comprise", "including" or "comprising" specifies a property, a region, a fixed number, a step, a process, an element and/or a component but does not exclude other properties, regions, fixed numbers, steps, processes, elements and/or components.

Hereinafter, exemplary embodiments of the inventive concept will be described in detail with reference to the accompanying drawings.

FIG. 1 is a block diagram illustrating a nonvolatile memory device according to an exemplary embodiment of the inventive concept.

A nonvolatile memory device according to an exemplary embodiment of the inventive concept may include a NAND flash memory device. However, it will be understood that the nonvolatile memory device is not limited to including a NAND flash memory device. For example, the nonvolatile memory device may include one of nonvolatile memory devices such as NOR flash memory devices, PRAM devices, FRAM devices, and MRAM devices.

Referring to FIG. 1, a flash memory device 100 includes a memory cell array 110, a row decoder 120, a control logic unit 130, and a data input/output (I/O) unit 140. The control logic unit 130 includes a voltage generator 135.

Memory cell array 110 includes memory cells for storing data. A plurality of memory cells constitutes a page. A plurality of pages constitutes a block. Due to its structural characteristics, flash memory device 100 performs read/write operations on a page basis and performs erase operations on a block basis.

Each memory block includes a plurality of cell strings connected to a plurality of bit lines BL0~BLm. As an example, one memory block is illustrated in FIG. 1. Each cell string includes: a string select transistor SST connected to a string select line SSL; a plurality of memory cells M0~Mn connected to a plurality of word lines WL0~WLn; and a ground select transistor GST connected to a ground select line GSL. The string select transistor SST is connected to a bit line BL0, and the ground select transistor GST is connected to a common source line CSL.

Each memory cell of memory cell array 110 may store single-bit data or multi-bit data. A memory cell capable of storing single-bit data is called a single-level cell (SLC), and a memory cell capable of storing multi-bit data is called a multi-level cell (MLC). A SLC has an erase state and a programmed state corresponding to different threshold voltages. An MLC has an erase state and a plurality of programmed states corresponding to different to threshold voltages.

Row decoder 120 is connected through the plurality of word lines WL0~WLn to memory cell array 110. Row decoder 120 receives an address ADDR. Row decoder 120 selects a block or a page of memory cell array 110 according to a row address. Control logic unit 130 controls an overall operation of flash memory device 100 in response to a control signal CTRL and a command CMD of an external device (e.g., a host, a memory controller, and a memory interface). For example, control logic unit 130 controls a read/write (or program/erase) operation of flash memory device 100. For this operation, control logic unit 130 controls voltage generator 135 to generate a bias voltage.

Voltage generator 135 of control logic unit 130 generates a bias voltage to be provided to a bit line in a read/write/erase operation. Also, voltage generator 135 generates a bias voltage to be provided to a word line in read/write/erase operations. For example, in a read operation, voltage generator 135 generates a select read voltage $V_{RD}$ provided to a selected word line and an unselect read voltage $V_{READ}$ provided to an unselected word line. As another example, in a write operation voltage generator 135 generates a program voltage $V_{PGM}$ and a programming verification voltage $V_{VRF}$ to be supplied to the word lines.

Data I/O unit 140 is connected through a plurality of bit lines BL0~BLm to memory cell array 110. Data I/O unit 140 includes a plurality of data I/O circuits 141_0~141_m. Data I/O circuits 141_0~141_m are respectively connected to the bit lines BL0~BLm. Data I/O unit 140 inputs/outputs data through a data I/O buffer (not illustrated).

Data I/O unit 140 reads data, stored in a selected memory cell among the memory cells, through a bit line. The read data are outputted from flash memory device 100 through data I/O unit 140. Also, data I/O unit 140 temporarily stores data to be programmed into a selected memory cell among the memory cells. The data stored in data I/O unit 140 is programmed into the selected memory cell in a programming step. Such an operation of data I/O unit 140 is performed under the control of control logic unit 130.

Flash memory device 100 applies a program voltage $V_{PGM}$ to a selected word line in a programming step and then performs a programming verification step. The programming verification step is performed to verify whether the threshold voltage of a memory cell has reached a target threshold value corresponding to a target programmed state. The programming verification step is performed simultaneously on a plurality of memory cells connected to a selected word line. Thus, the memory cells include memory cells requiring a programming verification step and memory cells not requiring a programming verification step. Herein, a memory cell not requiring a programming verification step may be a memory cell that has a threshold voltage that is less than the target threshold value for the target programmed state. Or, the memory cell not requiring a programming verification step may be a memory cell whose threshold voltage has already been verified as having reached the target threshold value corresponding to the target programmed state. Or, the memory cell not requiring a programming verification step may be a memory cell that is programmed from a different temporary programmed state to the target programmed state, for example in the case of an MLC device.

A programming verification step according to an exemplary embodiment of the inventive concept may include a selective verification step and a sequential verification step.

In the selective verification step, data I/O unit 140 selectively precharges a selected bit line according to the temporary programmed state of stored data. For example, data I/O unit 140 applies a bit line voltage to a bit line in order to precharge memory cells that are being programmed from the same temporary programmed state. On the other hand, data I/O unit 140 applies a ground voltage to a bit line in order not to precharge memory cells programmed from other temporary programmed states except for the temporary programmed state on which the selective verification step is performed. If a memory cell is determined, by the selective verification operation, to be a "program-passed" memory cell, that is, an OFF cell, then the subsequent sequential verification operation is performed only on the memory cell determined to be an OFF cell.

In the sequential verification step, data I/O unit 140 precharges each bit line according to the result of a previous selective verification operation or a previous sequential verification step. For example, data I/O unit 140 applies a bit line voltage to a bit line in order to precharge a bit line of a program-passed memory cell (i.e., an OFF cell) in a previous selective verification step or a previous sequential verification step. On the other hand, data I/O unit 140 applies a ground voltage to a bit line in order not to precharge a bit line of a program-failed memory cell (i.e., an ON cell) in the previous selective verification step or the previous sequential verification step.

Thus, according to an exemplary embodiment of the inventive concept, in the subsequent programming verification step, an ON cell current does not flow through the memory cell not requiring a programming verification step (e.g., a memory cell that has a threshold voltage less than a target threshold value corresponding to a target programmed state, a memory cell that has already reached a target programmed state, or a memory cell that is programmed from a different temporary programmed state). A decrease in the ON cell current causes a decrease in the noise of the common source line CSL that is generated when a current flows through the common source line CSL. Such an operation will be described below in detail with reference to FIG. 7.

Figure 2:
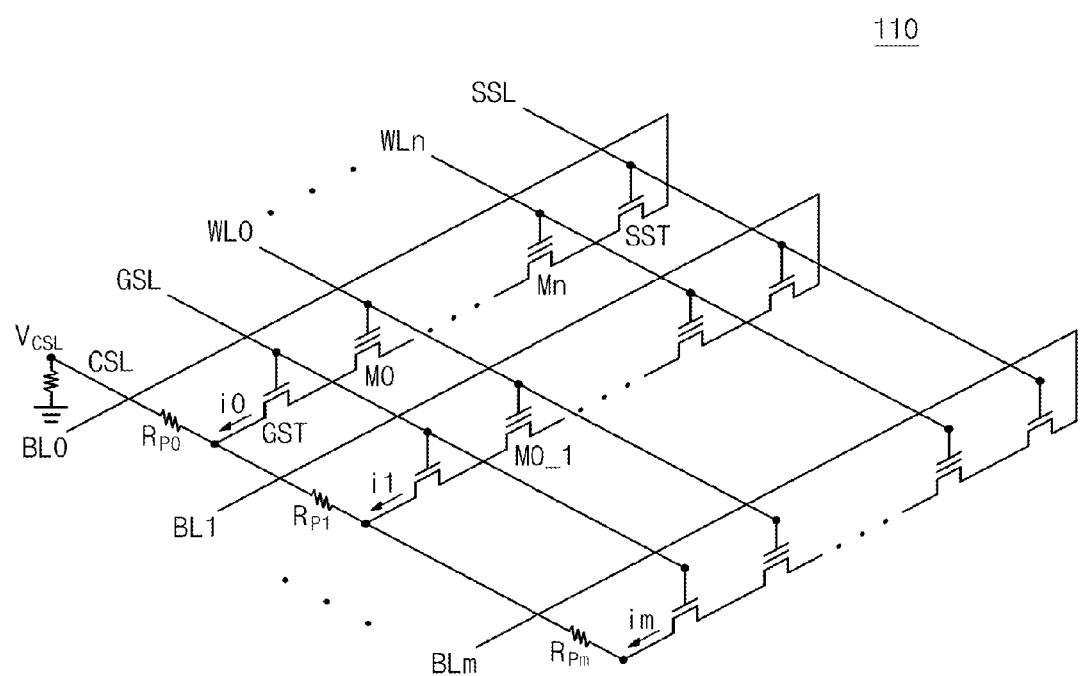
FIG. 2 is a circuit diagram illustrating the structure of a memory cell array illustrated in FIG. 1.

FIG. 2 is a circuit diagram illustrating the structure of a memory cell array illustrated in FIG. 1.

Referring to FIG. 2, one memory block included in memory cell array 110 is illustrated. Memory cell array 110 includes a plurality of memory blocks, and each of the memory blocks includes a plurality of cell strings connected to a plurality of bit lines BL0~BLm. Each of the cell strings includes a plurality of memory cells connected between a bit line BL and a common source line CSL. Each of the cell strings includes a string select transistor SST connected to a string select line SSL, a plurality of memory cells connected to a plurality of word lines WL0~WLn, and a ground select transistor GST connected to a ground select line GSL.

The string select transistor SST is connected to the bit line BL0, and the ground select transistor GST is connected to the common source line CSL. Resistances $R_{P0}$~$R_{Pm}$ are a resistance component present in the common source line CSL. For example, the resistances $R_{P0}$~$R_{Pm}$ each represent a parasitic resistance or an impedance from a parasitic capacitance of the common source line CSL (hereinafter referred to as a parasitic resistance).

In a programming verification step or in a data read operation, the amount of current flowing through a cell string changes depending on the number of ON cells. Also, a common source line voltage $V_{CSL}$ changes depending on the amount of current flowing through a cell string. The following two assumptions are made to describe a change in the common source line voltage $V_{CSL}$ depending on the number of ON cells. First, it is assumed that the memory cell M0 connected to the selected word line WL0 has an erased state and the memory cell M0_1 connected to the selected word line WL0 has a programmed state. Second, it is assumed that the currents flowing through the cell strings that include M0 and M0_1 are respectively i0 and i1 when the memory cell connected to the selected word line WL0 is an ON cell.

From the above assumptions, the common source line voltage $V_{CSL}$ changes depending on the number of ON cells. For example, if only the memory cell M0 connected to the selected word line WL0 of the bit line BL0 is an ON cell and the memory cell M0_1 connected to the selected word line WL0 of the bit line BL1 is an OFF cell, the voltage applied across the resistance $R_{P0}$ becomes $i0 \times R_{P0}$ to generate the common source line voltage $V_{CSL}$. As another example, if the memory cells M0 and M0_1 connected to the selected word line WL0 of the bit lines BL0 and BL1 are ON cells, the voltage applied across the resistance $R_{P0}$ becomes $i0 \times R_{P0}$ and the voltage applied across the resistance $R_{P1}$ becomes $i1 \times R_{P1}$ to generate the common source line voltage $V_{CSL}$. This means that the common source line voltage $V_{CSL}$ may also change in response to a change in the number of ON cells in a programming verification step. To address this issue, the programming verification step according to an exemplary embodiment of the inventive concept selectively precharges a memory cell through a selective programming verification step and a sequential programming verification step, thus reducing the number of ON cells during each verification step.

Figure 3:
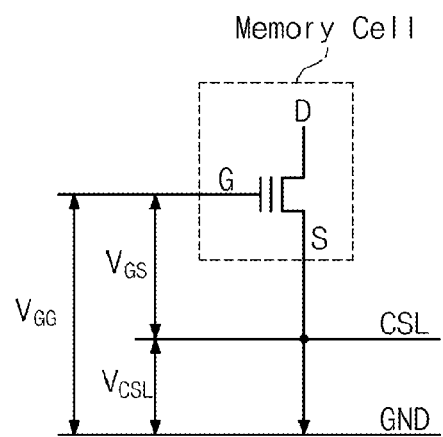
FIG. 3 is a diagram illustrating an error in the threshold voltage of a memory cell.

FIG. 3 is a diagram illustrating an error in the threshold voltage of a memory cell.

Referring to FIG. 3, one memory cell included in memory cell array 110 of FIG. 1 is illustrated. In FIG. 3, reference characters G, S and D respectively denote a control gate, a source and a drain of the memory cell. When a current flows through the common source line CSL, a voltage change of the common source line CSL may occur due to a parasitic resistance, as explained above with respect to FIG. 2. Such a voltage change of the common source line CSL becomes a noise voltage of the common source line CSL, that is, a common source line voltage $V_{CSL}$.

Meanwhile, a control gate G of the memory cell is controlled according to the voltage provided from voltage generator 135 of FIG. 1. Voltage generator 135 generates a voltage $V_{GG}$ on the basis of a (i.e., with respect to) ground GND. However, the channel formed in the read operation or the programming verification step of the memory cell is controlled according to the voltage difference $V_{GS}$ between the source S and the control gate G of the memory cell. Thus, there is a voltage difference $V_{CSL}$ between the voltage $V_{GG}$ supplied to the control gate G of the memory cell and the voltage $V_{GS}$ influencing the channel formation of the memory cell.

The common source line voltage $V_{CSL}$ may cause a detection error by data I/O unit 140 in a programming verification step or a read operation. The common source line voltage $V_{CSL}$ depends on the ON or OFF state according to the data of memory cells. Thus, the common source line voltage $V_{CSL}$ is irregular, changes frequently, and is difficult to remove.

Figure 4:
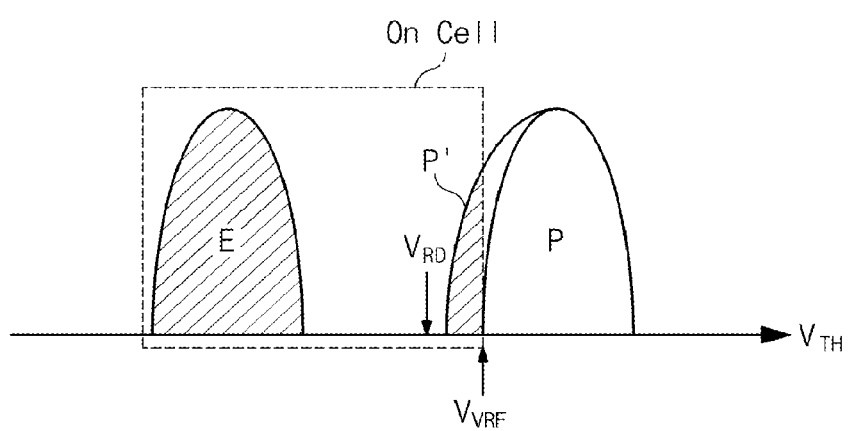
FIG. 4 is a diagram illustrating threshold voltages for ON cells when a programming verification voltage is applied to a selected word line.

FIG. 4 is a diagram illustrating threshold voltages for ON cells when a programming verification voltage is applied to a selected word line.

Referring to FIG. 4, an example for a single-level cell (SLC) storing 1-bit data is illustrated. Memory cells are divided into those having an erased state E and those having a programmed state P according to their threshold voltages. In a read operation, a select read voltage $V_{RD}$ is provided to a selected word line. In a programming verification step, a programming verification voltage $V_{VRF}$ is provided to a selected word line.

When the programming verification voltage $V_{VRF}$ is applied, the memory cells that are identified as ON cells are those memory cells whose threshold voltages are included in the hatched region in FIG. 4. This, a memory cell with an erased state E is identified as an ON cell. Additionally, among the memory cells to be programmed to a programmed state P, a memory cell with a threshold voltage P' not exceeding the programming verification voltage $V_{VRF}$ also may be identified as an ON cell.

As illustrated in FIG. 2, the common source line CSL is connected through an electrically conductive (e.g., metal) line to a ground terminal As shown in FIG. 2, the electrically conductive line has a resistance component. Therefore, when a current flows through the common source line CSL, the common source line voltage $V_{CSL}$ changes. Herein, the common source line voltage $V_{CSL}$ is proportional to the cell current caused by an ON cell. For example, if the number of ON cells of the memory cells connected to a selected word line increases and thus the amount of current flowing through the common source line CSL increases, the common source line voltage $V_{CSL}$ may also increase. Such a change in the common source line voltage $V_{CSL}$ becomes a noise present in the common source line CSL.

Figure 5:
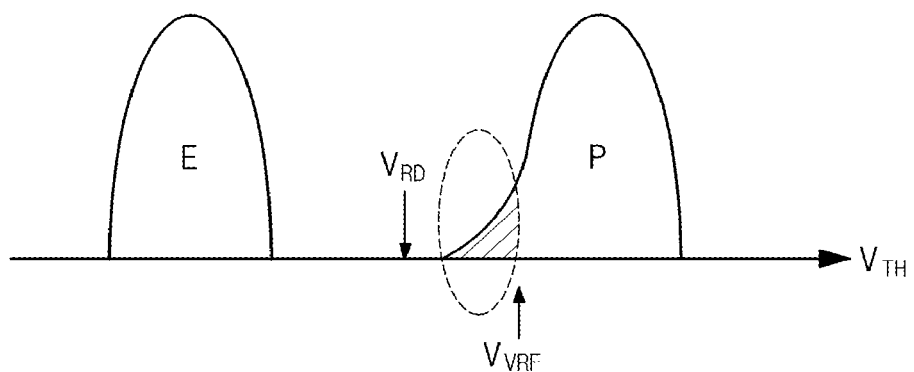
FIG. 5 is a diagram illustrating the threshold voltage distribution of memory cells influenced by a noise voltage present in a common source line.

FIG. 5 is a diagram illustrating the threshold voltage distribution of a memory cell influenced by a noise voltage present in a common source line.

Referring to FIG. 5, the threshold voltage distribution of memory cells that are not completely programmed is illustrated. As described above, when the number of ON cells in a programming verification step increases, the amount of current flowing through the common source line CSL increases. When the amount of a current flowing through the common source line CSL increases, the common source line voltage $V_{CSL}$ increases due to the influence of a parasitic resistance as described above. When the common source line voltage $V_{CSL}$ increases, the amount of a current sensed by data I/O unit 140 of FIG. 1 decreases.

When the amount of a current sensed by data I/O unit 140 decreases, the threshold voltage distribution of memory cells regarded as having reached a programmed state P may be widened to include some cells with lower threshold voltages as shown in the hatched region inside the dotted line in FIG. 5, so that the programming operation may be completed for cells having those lower threshold voltages. That is, although a memory cell has not been completely programmed, it may be verified as having been successfully programmed ("program-passed"), so that the programming operation may be completed. In this case, the threshold voltage distribution of the OFF memory cells widens due to the memory cells distributed in a hatched region inside the dotted line of FIG. 5. After completion of the programming operation, the memory cells with a threshold voltage not exceeding the programming verification voltage $V_{VRF}$ may be read as non-programmed memory cells.

Figure 6:
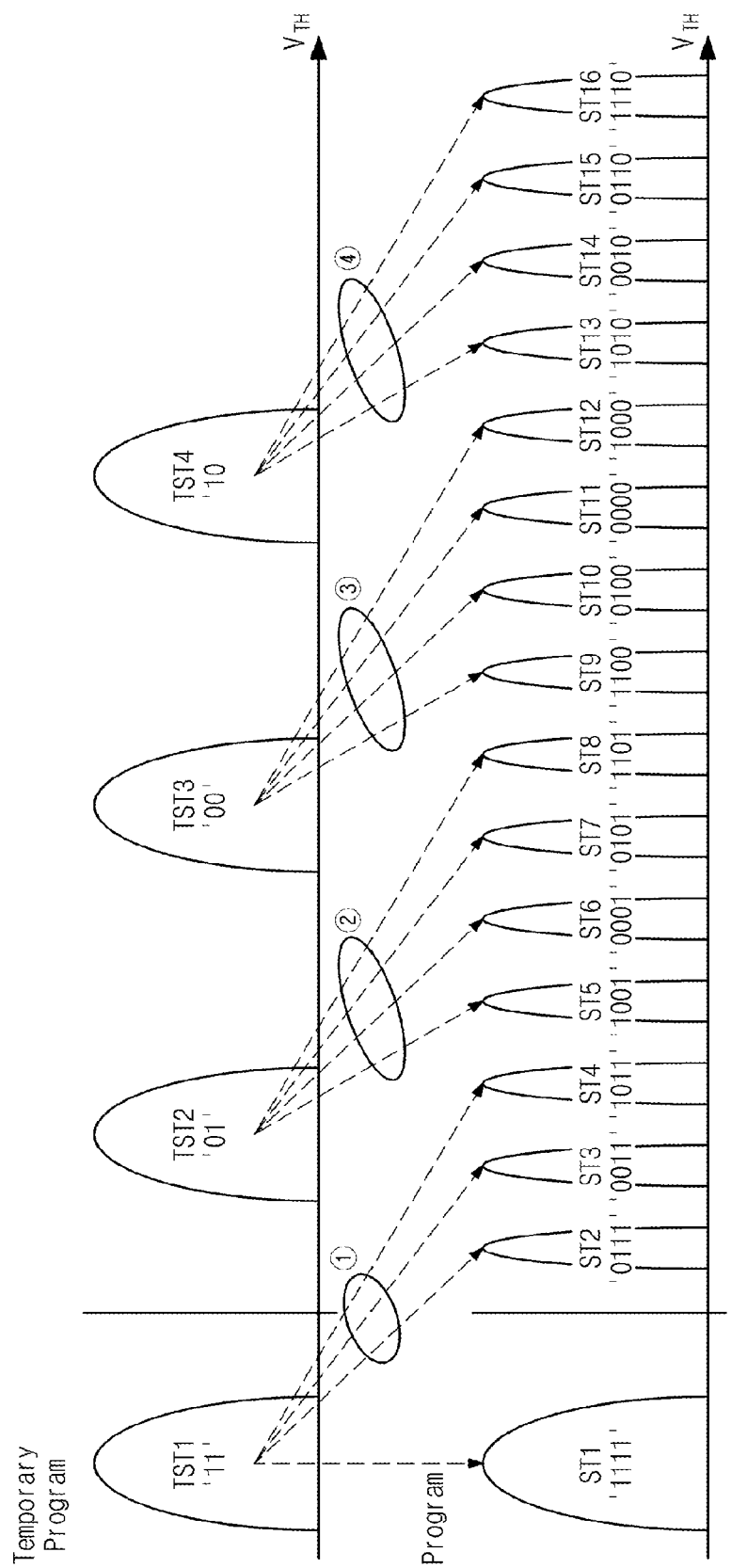
FIG. 6 is a diagram illustrating the programmed states of a multi-level cell according to an exemplary embodiment of the inventive concept.

FIG. 6 is a diagram illustrating the programmed states of a multi-level cell according to an exemplary embodiment of the inventive concept.

A multi-level cell (MLC) has an erased state and a plurality of programmed states corresponding to different threshold voltages. In the multi-level cell, it is important to narrow the threshold voltage distribution of the programmed states in order to increase the data reliability.

Referring to FIG. 6, in order to narrow the threshold voltage distribution, a multi-level cell may be programmed from temporary programmed states TST1~TST4 (namely, TST1, TST2, TST3 and TST4) produced by a temporary programming operation to target programmed states ST1~ST16 (namely, ST1, ST2, ST3, ST4, ST5, ST6, ST7, ST8, ST9, ST10, ST11, ST12, ST13, ST14, ST15 and ST16, respectively corresponding to data states 1111, 0111, 0011, 1011, 1001, 0001, 0101, 1101, 1100, 0100, 0000, 1000, 1010, 0010, 0110 and 1110). The temporary programmed states TST1~TST4 and the target programmed states ST1~ST16 are determined according to the data values of pages. For example, the temporary programmed states TST1~TST4 and the target programmed states ST1~ST16 may be determined according to the data values of first and second MSB (Most Significant Bit) pages and first and second LSB (Least Significant Bit) pages.

FIG. 6 illustrates the threshold voltage distribution of a multi-level cell that stores 4-bit data. The memory cell is programmed to one of the 16 target programmed states ST1~ST16 according to the data values of pages. In order to narrow the threshold voltage distribution, memory cells are programmed from the temporary programmed state TST1 to the target programmed states ST2~ST4. This programming operation is represented by dotted arrows ①. As represented by dotted arrows ②, ③ and ④, memory cells are also programmed from the temporary programmed states TST2/TST3/TST4 to the target programmed states ST5~ST8/ST9~ST12/ST13~ST16, respectively.

For a better understanding, a memory cell programmed from the temporary programmed state TST1 is described as an example. The memory cell with a temporary programmed state TST1 (i.e., a '11' state) maintains a target programmed state ST1 (i.e., a '1111' state) according to the first and second MSBs. Or, the memory cell with a temporary programmed state TST1 (i.e., a '11' state) is programmed to a target programmed state ST2 (i.e., a '0111' state), a target programmed state ST3 (i.e., a '0011' state), or a target programmed state ST4 (i.e., a '1011' state) according to the first and second MSBs. That is, the memory cell is programmed to a target programmed state on the basis of a temporary programmed state. According to an exemplary embodiment, in a target programming verification step, a programming verification step is performed not only on a target programmed state but also on a temporary programmed state. Also, in the target programming verification step, the memory cell is selectively precharged according to a temporary programmed state and a target programmed state.

Figure 7:
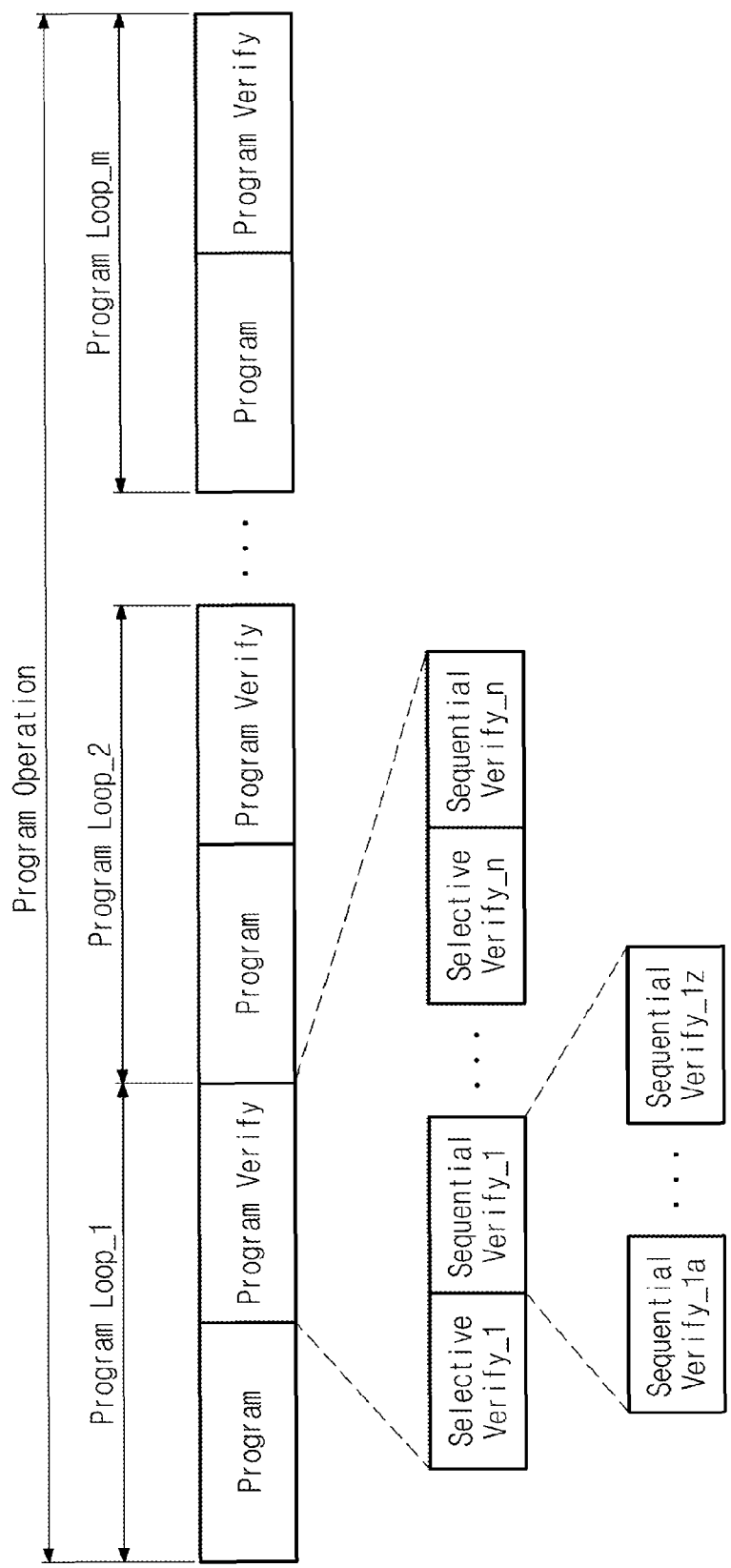
FIG. 7 is a flow diagram illustrating a programming operation according to an exemplary embodiment of the inventive concept.

FIG. 7 is a flow diagram illustrating a programming step according to an exemplary embodiment of the inventive concept.

Referring to FIG. 7, flash memory device 100 of FIG. 1 uses an incremental step pulse program (ISPP) scheme in order to narrow the threshold voltage distribution of a memory cell. According to the ISPP scheme, control logic unit 130 of FIG. 1 controls voltage generator 135 of FIG. 1 in order to gradually increase a programming voltage applied to a selected word line. The programming voltage that is applied to the selected word line is increased by a predetermined increment ΔV during each program loop until completion of the programming operation. Therefore, the programming operation includes a plurality of program loops Program Loop_1~Program Loop_m. Each of the program loops includes a programming step and a programming verification step. In the programming step, the memory cell is programmed according to given bias conditions (e.g., a programming voltage is applied to a word line and a bit line voltage is applied to a bit line). In the programming verification step, it is verified whether or not the memory cell is programmed to the target programmed state. The control logic unit 130 repeats the program loop for a predetermined number of times (e.g., m) until all of the memory cells are programmed.

Although not illustrated in the drawings, a programming verification step includes a precharge interval, a develop interval, a sensing interval, and a discharge interval. A predetermined voltage is applied to a bit line in the precharge interval, a verification voltage $V_{VRF}$ is applied to a word line in the develop interval, and the state of a memory cell is determined in the sensing interval. It will be understood that the programming verification step may be identical to a data read operation with the exception that the read data are not outputted from the memory device to an external device.

The programming verification step includes a plurality of selective verification steps Selective Verify_1~Selective Verify_n, and a plurality of sequential verification steps Sequential Verify_1~Sequential Verify_n, where n (e.g., n=4) corresponds to the number of temporary programmed states. The selective verification step is to verify the memory cell according to a temporary programmed state, in order to reduce an ON cell current, before verifying whether the memory cell has been programmed to a target programmed state. The sequential verification step is performed to verify the memory cell according to the result of a previous selective verification step or a previous sequential verification step. Thus, the respective sequential verification steps are performed after the respective selective verification steps. Also, as shown in FIG. 7, each of the sequential verification steps Sequential Verify_1~Sequential Verify_n includes a plurality of sequential verification sub-steps Sequential Verify_1a~Sequential Verify_1z corresponding to the number of target programmed states z (e.g., z=4) that can be programmed from one temporary programmed state.

As illustrated in FIG. 1, the data I/O circuits 141_0~141_m correspond respectively to the bit lines BL0~BLm. In the selective verification step, each of the data I/O circuits 141_0~141_m selectively activates the corresponding bit line according to the temporary programmed state of stored data. For example, in the selective verification step, each of the data I/O circuits 141_0~141_m precharges the corresponding bit line for each of the temporary programmed states of stored data.

After completion of the selective verification step, the programmed state (e.g., program-passed or program-failed) of the memory cell connected to the precharged bit line is determined according to the state of the memory cell, and the determined programmed state is stored in the corresponding data I/O circuit. On the other hand, the programmed state (e.g., program-passed or program-failed) of the memory cell connected to the non-precharged bit line (i.e., the memory cell programmed from another temporary programmed state) is determined to be program-failed, and the determined programmed state is stored in the corresponding data I/O circuit.

The subsequent sequential verification step is not performed on memory cells that are determined to be program-failed in the selective verification step (i.e., memory cells that are determined to be ON cells). That is, the subsequent sequential verification step is performed only on the memory cells that are determined to be OFF cells in the selective verification step. Thus, the number of ON cells in the sequential verification step can be reduced.

In the sequential verification step, each of the data I/O circuits 141_0~141_m selectively activates the corresponding bit line according to the result of the previous selective verification step or the previous sequential verification step. For example, in the sequential verification step, each of the data I/O circuits 141_0~141_m precharges only the bit lines of memory cells that are determined to be program-passed in the previous selective verification step or the previous sequential verification step (i.e., memory cells that are determined to be OFF cells). That is, the sequential verification step is not performed on the memory cells failing to approach the target programmed state. Thus, the number of ON cells in the sequential verification step can be reduced.

Figure 8:
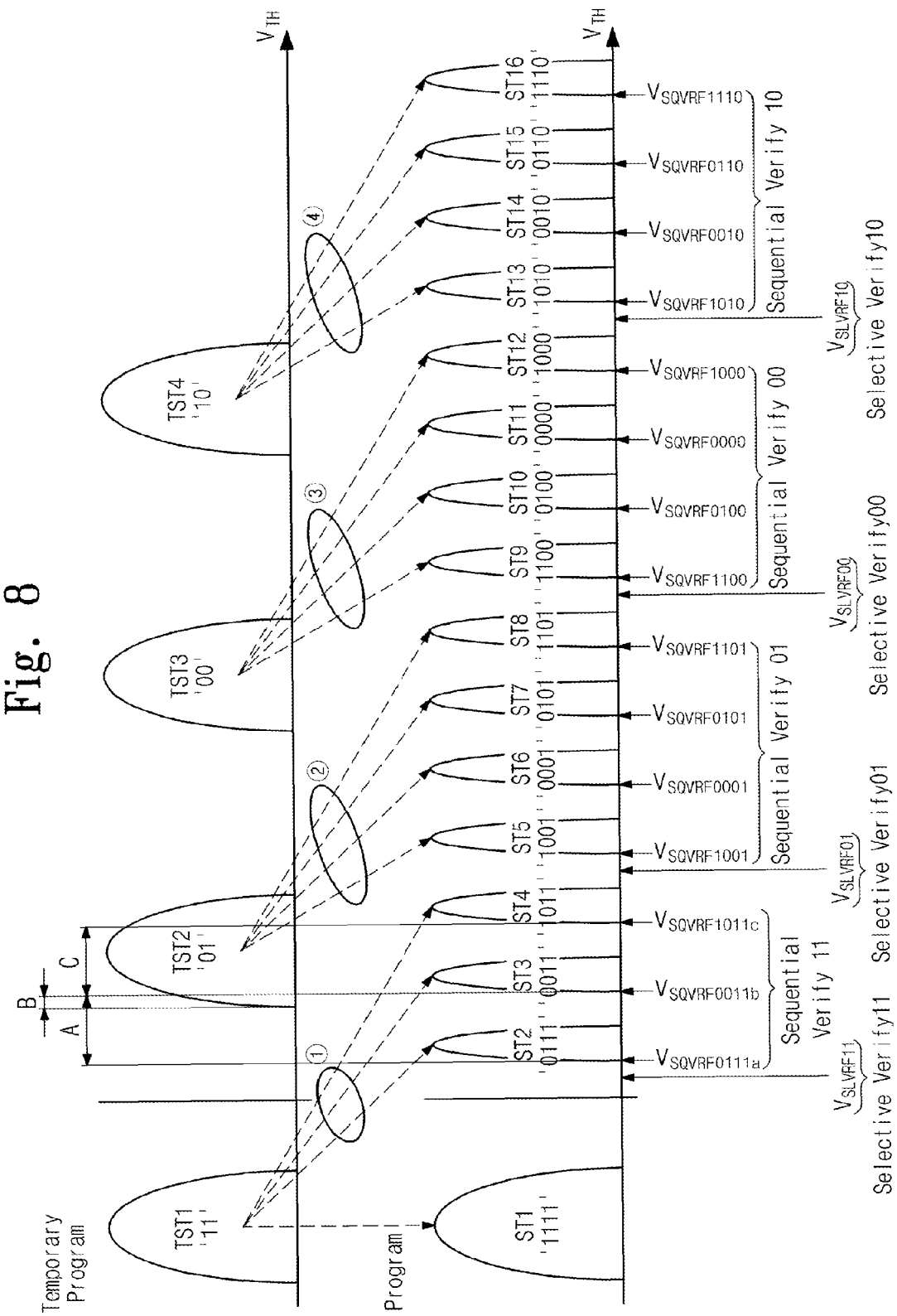
FIG. 8 is a diagram illustrating the programming verification voltages of a multi-level cell according to an exemplary embodiment of the inventive concept.

FIG. 8 is a diagram illustrating the programming verification voltages of a multi-level cell according to an exemplary embodiment of the inventive concept. As with FIG. 6, FIG. 8 also shows temporary programmed states TST1~TST4 (namely, TST1, TST2, TST3 and TST4) and target programmed states ST1~ST16 (namely, ST1, ST2, ST3, ST4, ST5, ST6, ST7, ST8, ST9, ST10, ST11, ST12, ST13, ST14, ST15 and ST16, respectively corresponding to data states 1111, 0111, 0011, 1011, 1001, 0001, 0101, 1101, 1100, 0100, 0000, 1000, 1010, 0010, 0110 and 1110). Also shown in FIG. 8 are verification voltages $V_{SQVRF0111a}$, $V_{SQVRF011b}$, $V_{SQVRF1011c}$, $V_{SQVRF1001}$, $V_{SQVRF0001}$, $V_{SQVRF0101}$, $V_{SQVRF1101}$, $V_{SQVRF1100}$, $V_{SQVRF0100}$, $V_{SQVRF0000}$, $V_{SQVRF1000}$, $V_{SQVRF1010}$, $V_{SQVRF0010}$, $V_{SQVRF0110}$, and $V_{SQVRF1110}$, respectively corresponding to programmed states ST2~ST16.

As illustrated in FIG. 7, a programming verification step according to an exemplary embodiment of the inventive concept includes a plurality of selective verification steps and a plurality of sequential verification steps.

Referring to FIG. 8, control logic unit 130 of FIG. 1 applies selective verification voltages $V_{SLVRF11}$, $V_{SLVRF01}$, $V_{SLVRF00}$ and $V_{SLVRF10}$ to a selected word line to perform selective verification steps Selective Verify 11, Selective Verify 01, Selective Verify 00 and Selective Verify 10. Also, control logic unit 130 applies sequential verification voltages $V_{SQVRFxx11}$, $V_{SQVRFxx01}$, $V_{SQVRFxx00}$ and $V_{SQVRFxx10}$ to a selected word line to perform sequential verification steps Sequential Verify 11, Sequential Verify 01, Sequential Verify 00 and Sequential Verify 10.

For a better understanding of the programming operation illustrated in FIG. 7, the programming operation of a memory cell programmed from the temporary programmed state TST1 to the target programmed states ST2, ST3 and ST4 will be described with reference to FIGS. 1 and 8.

Control logic unit 130 applies the programming voltage $V_{PGM}$, which is used to program to the target programmed states ST2, ST3 and ST4, to a selected word line according to the data stored in data I/O unit 140. Thereafter, control logic unit 130 applies the programming verification voltages $V_{VRF}$ to the selected word line in order to perform a programming verification step. That is, control logic unit 130 sequentially applies the first selective verification voltage $V_{SLVRF11}$ and the first to third sequential verification voltages $V_{SQVRFxx11}$ to the selected word line.

During the first selective verification step Selective Verify 11 for the temporary programmed state TST1, only the data I/O circuits of the memory cells programmed from the temporary programmed state TST1 (i.e., the memory cells whose target programmed states are ST2, ST3 and ST4) precharges each bit line. When control logic unit 130 applies the first selective verification voltage $V_{SLVRF11}$ to the selected word line, the programmed state (e.g., program-passed or program-failed) of the memory cells connected to the precharged bit lines are determined according to the state of the memory cell, and the determined programmed state is stored in the corresponding data I/O circuit. At this point, the data I/O circuits of the memory cells not programmed from the temporary programmed state TST1 (i.e., the memory cells programmed from the temporary programmed states ST2, ST3 and ST4) stores the programmed state as program-failed (i.e., the memory cell is an ON cell).

After the first selective verification step Selective Verify 11, a first sequential verification sub-step Sequential Verify 11a is performed on the target programmed state ST2. During the first sequential verification sub-step Sequential Verify 11a, only the data I/O circuit storing the result of the first selective verification step Selective Verify 11 as program-passed (i.e., the data I/O circuit of the memory cell determined to be an OFF cell) precharges each bit line. When control logic unit 130 applies the first sequential verification voltage $V_{SQVRF0111}$ to the selected word line, the programmed state (e.g., program-passed or program-fail) of the memory cell connected to the precharged bit line is determined according to the state of the memory cell and the determined programmed state is stored in the corresponding data I/O circuit.

After the first sequential verification sub-step Sequential Verify 11a, a second sequential verification sub-step Sequential Verify 11b is performed on the target programmed state ST3. During the second sequential verification sub-step Sequential Verify 11b, only the data I/O circuit storing the result of the first sequential verification sub-step Selective Verify 11a as program-passed (i.e., the data I/O circuit of the memory cell determined to be an OFF cell) precharges each bit line. When control logic unit 130 applies the second sequential verification voltage $V_{SQVRF0011}$ to the selected word line, the programmed state (e.g., program-passed or program-failed) of the memory cell connected to the precharged bit line is determined according to the state of the memory cell and the determined programmed state is stored in the corresponding data I/O circuit. At this point, an ON cell current flows through any memory cells with a threshold voltage that is greater than the first sequential verification voltage $V_{SQVRF0111}$ and any memory cells with a threshold voltage that is less than the second sequential verification voltage $V_{SQVRF0011}$. That is, an ON cell current flows through the memory cells having a threshold voltage within an interval "A" as shown in FIG. 8.

Meanwhile, during the second sequential verification sub-step Sequential Verify 11b, an ON cell current does not flow through memory cells having a threshold voltage within an interval "B" as shown in FIG. 8 among the memory cells programmed from the temporary programmed state TST2 to the target programmed states ST5, ST6, ST7 and ST8. This is because, in the case of the data I/O circuits of the memory cells programmed from the temporary programmed states TST2, TST3 and TST4 other than the temporary programmed state TST1, the programmed state is stored as program-failed in the first selective verification step Selective Verify 11 (i.e., determined to be an ON cell) and thus the corresponding bit line is not precharged in the second sequential verification sub-step Sequential Verify 11b. Thus, the ON cell current is reduced.

After the second sequential verification sub-step Sequential Verify 11b, a third sequential verification sub-step Sequential Verify 11c is performed on the target programmed state ST4. During the third sequential verification sub-step Sequential Verify 11c, only the data I/O circuits storing the result of the second sequential verification sub-step Selective Verify 11b as program-passed (i.e., the data I/O circuits of the memory cell determined to be OFF cells) precharge their corresponding bit lines. When control logic unit 130 applies the third sequential verification voltage $V_{SQVRF1011}$ to the selected word line, the programmed state of a memory cell (e.g., program-passed or program-failed) connected to a precharged bit line is determined according to the state of the memory cell, and the determined programmed state is stored in the corresponding data I/O circuit. At this point, an ON cell current flows through memory cells with a threshold voltage that is greater than the second sequential verification voltage $V_{SQVRF0011}$ and the memory cells with a threshold voltage that is less than the third sequential verification voltage $V_{SQVRF1011}$. That is, an ON cell current flows through the memory cells having a threshold voltage within an interval "C" as shown in FIG. 8.

Meanwhile, during the third sequential verification sub-step Sequential Verify 11c, an ON cell current does not flow through memory cells having a threshold voltage within the interval "C" among the memory cells programmed from the temporary programmed state TST2 to the target programmed states ST5, ST6, ST7 and ST8. This is because, in the case of the data I/O circuits of the memory cells programmed from the temporary programmed states TST2, TST3 and TST4 other than the temporary programmed state TST1, the programmed state is stored as program-failed in the first selective verification step Selective Verify 11 (i.e., determined to be an ON cell) and thus the corresponding bit line is not precharged in the third sequential verification sub-step Sequential Verify 11c. Thus, the ON cell current is reduced.

Figure 9:
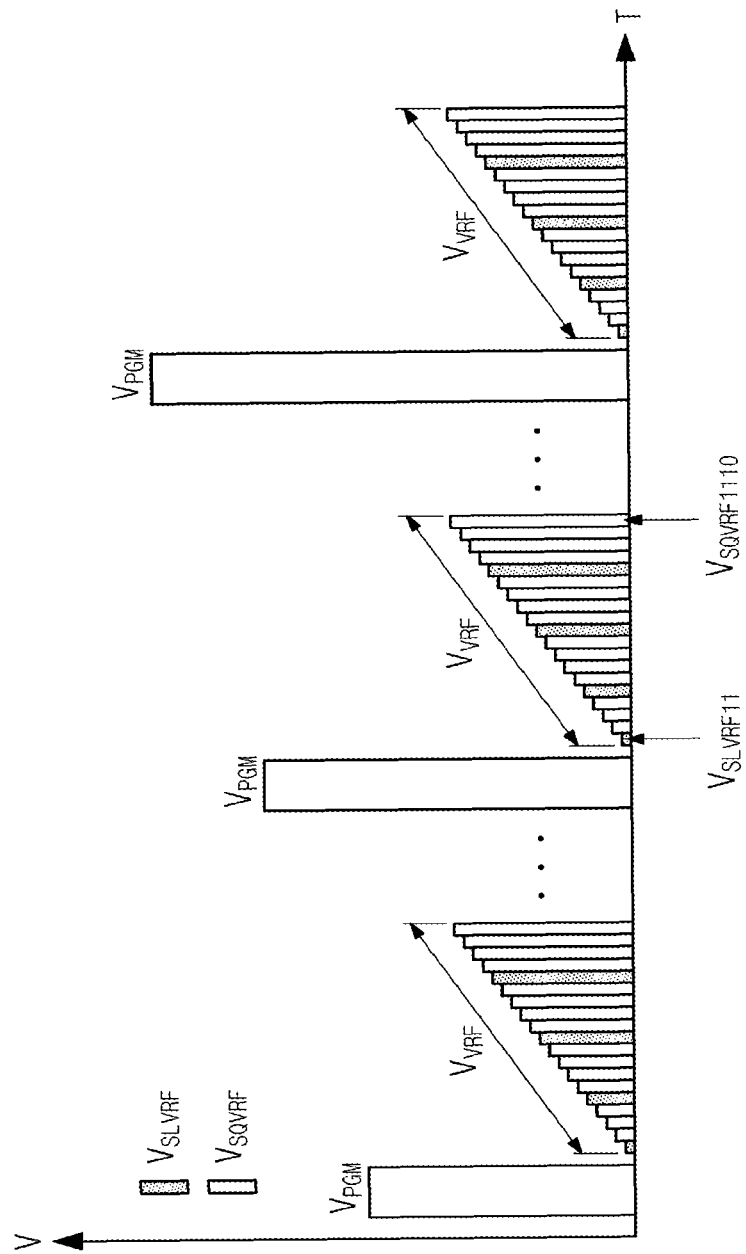
FIG. 9 is a diagram illustrating the bias conditions of a programming operation according to an exemplary embodiment of the inventive concept.

FIG. 9 is a diagram illustrating the bias conditions of a programming operation according to an exemplary embodiment of the inventive concept.

Referring to FIGS. 8 and 9, control logic unit 130 of FIG. 1 applies the programming voltage $V_{PGM}$, which is used to program to the target programmed states, to a selected word line according to the data stored in data I/O unit 140 of FIG. 1. Thereafter, control logic unit 130 applies the programming verification voltages $V_{VRF}$ to the selected word line in order to perform a programming verification step. That is, control logic unit 130 sequentially applies the first selective verification voltage $V_{SLVRF11}$, the first to third sequential verification voltages $V_{SQVRFxx11}$, the second selective verification voltage $V_{SLVRF01}$, the fourth to seventh sequential verification voltages $V_{SQVRFxx01}$, the third selective verification voltage $V_{SLVRF00}$, the eighth to eleventh sequential verification voltages $V_{SQVRFxx00}$, the fourth selective verification voltage $V_{SLVRF10}$, and the twelfth to fifteenth sequential verification voltages $V_{SQVRFxx10}$ to the selected word line.

Then the programming voltage is increased by a predetermined increment $\Delta V$ and applied to the selected word line, followed by repeating the programming verification step described above, until completion of the programming operation. That is, the programming verification voltages (the selective verification voltages and the sequential verification voltages) are sequentially applied each time after the programming voltage is applied. The applied programming verification voltages (the selective verification voltages and the sequential verification voltages) increase gradually in the order of application. That is, the first selective verification voltage $V_{SLVRF11}$ has the smallest voltage value, and the fifteenth sequential verification voltage $V_{SQVRF1110}$ has the greatest voltage value. Also, the programming verification voltages (the selective verification voltages and the sequential verification voltages) are less than the programming voltage.

Figure 10:
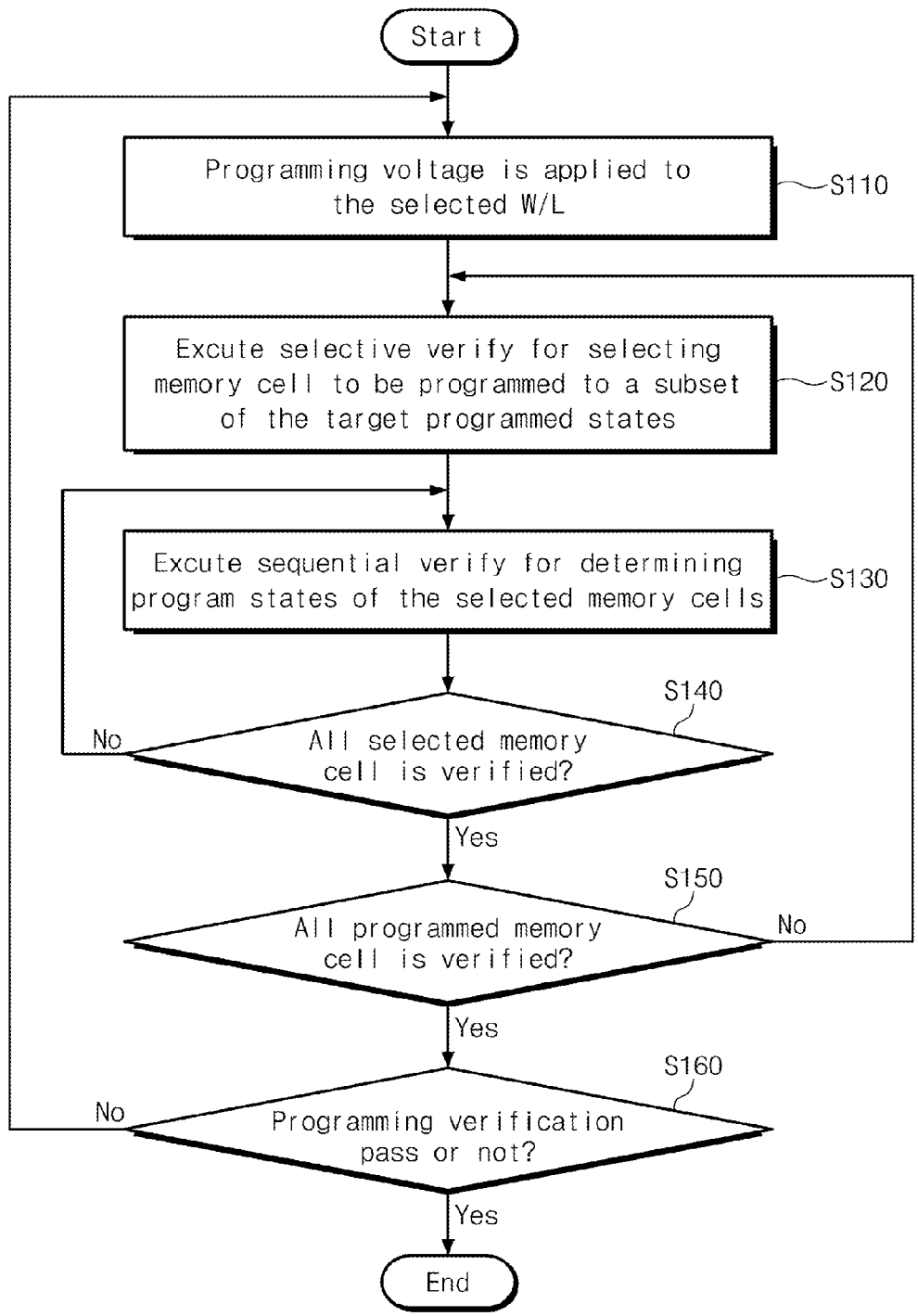
FIG. 10 is a flow chart illustrating a programming operation according to an exemplary embodiment of the inventive concept.

FIG. 10 is a flow chart illustrating a programming operation according to an exemplary embodiment of the inventive concept.

A programming operation according to an exemplary embodiment of the inventive concept will be described below with reference to FIGS. 1 and 10.

Referring to FIGS. 1 and 10, control logic unit 130 applies the program voltage VPGM, which is used to program to the target programmed state, to a selected word line according to the data stored in data I/O unit 140 (S110). Thereafter, control logic unit 130 performs selective verification for selecting memory cell to be programmed to a subset of the target programmed states based on the temporary state of the stored data (S120). During the selective verification, each of the data I/O circuits 140 selectively precharges the corresponding bit line only when the selective verification is performed on the subset of the target programmed states. The subset of the target programmed states may be programmed states that is programmed from the temporary programmed state of the stored data. The control logic unit 130 controls voltage generator 135 in order to apply the selective verification voltage VSLVRF to the selected word line. After completion of the selective verification, the programmed state of the memory cell connected to the precharged bit line is determined according to the state of the memory cell and the determined programmed state is stored in the corresponding data I/O circuit.

After the selective verification, control logic unit 130 performs a sequential verification for determining a programmed states of the selected memory cells (S130). During the sequential verification, each of the data I/O circuits 140 selectively precharges the corresponding bit line according to the result of the previous selective verification or the previous sequential verification. That is, each of the data I/O circuits 140 precharges only the bit line of the memory cell that is program-passed in the previous selective verification or the previous sequential verification.

The control logic unit 130 controls voltage generator 135 in order to apply the sequential verification voltage VSQVRF to the selected word line. After completion of the sequential verification step, the programmed state of the memory cell connected to the precharged bit line is determined according to the state of the memory cell and the determined programmed state is stored in the corresponding data I/O circuit.

As an example, the sequential verification may include a plurality of sequential verification substeps. The control logic unit 130 determines whether the sequential verification has been performed on all of the programmed states of selected memory cells on which the selective verification step is performed (S140). If the sequential verification has not been performed on all the programmed states of selected memory cells on which the selective verification is performed, then control logic unit 130 performs the sequential verification sub-steps (S130) on the other selected memory cells sequentially from the target programmed state with the smallest threshold voltage.

If the sequential verification has been performed on all of the selected memory cells on which the selective verification is performed (S140), then control logic unit 130 determines whether the selective verification has been performed on all of the programmed memory cells (S150). If the selective verification has not been performed on all of the programmed memory cells (S150), then control logic unit 130 performs the selective verification (S 120) on the other of programmed memory cells sequentially from the temporary programmed state with the smallest threshold voltage.

If the selective verification on all of the programmed memory cells and the sequential verification step on all of the selected memory cells have been performed sequentially according to the threshold voltages, then control logic unit 130 determines whether all the memory cells to be programmed are program-passed (S160). If all of the memory cells to be programmed are program-passed (S160), then control logic unit 130 ends the programming step. If all the memory cells to be programmed are not program-passed (S160), then control logic unit 130 repeats the application of the programming voltage (S110), the selective verification (S120) and the sequential verification (S130) for a predetermined number of times.

The programming verification step according to an exemplary embodiment of the inventive concept includes a selective verification step and a sequential verification step. In the selective verification step, data I/O unit 140 selectively precharges the corresponding bit line according to the temporary programmed state of the stored data. In the sequential verification step, data I/O unit 140 selectively precharges each bit line according to the result of the previous selective verification step or the previous sequential verification step. Thus, in the subsequent programming verification step, an ON cell current does not flow through a memory cell not requiring a programming verification step (e.g., a memory cell that has a threshold voltage that is less than the threshold voltage for the target programmed state, a memory cell that has reached the target programmed state, or a memory cell that is programmed from a different temporary programmed state). A decrease in the ON cell current causes a decrease in the noise voltage of the common source line CSL that is generated when current flows through the common source line CSL.

Figure 11:
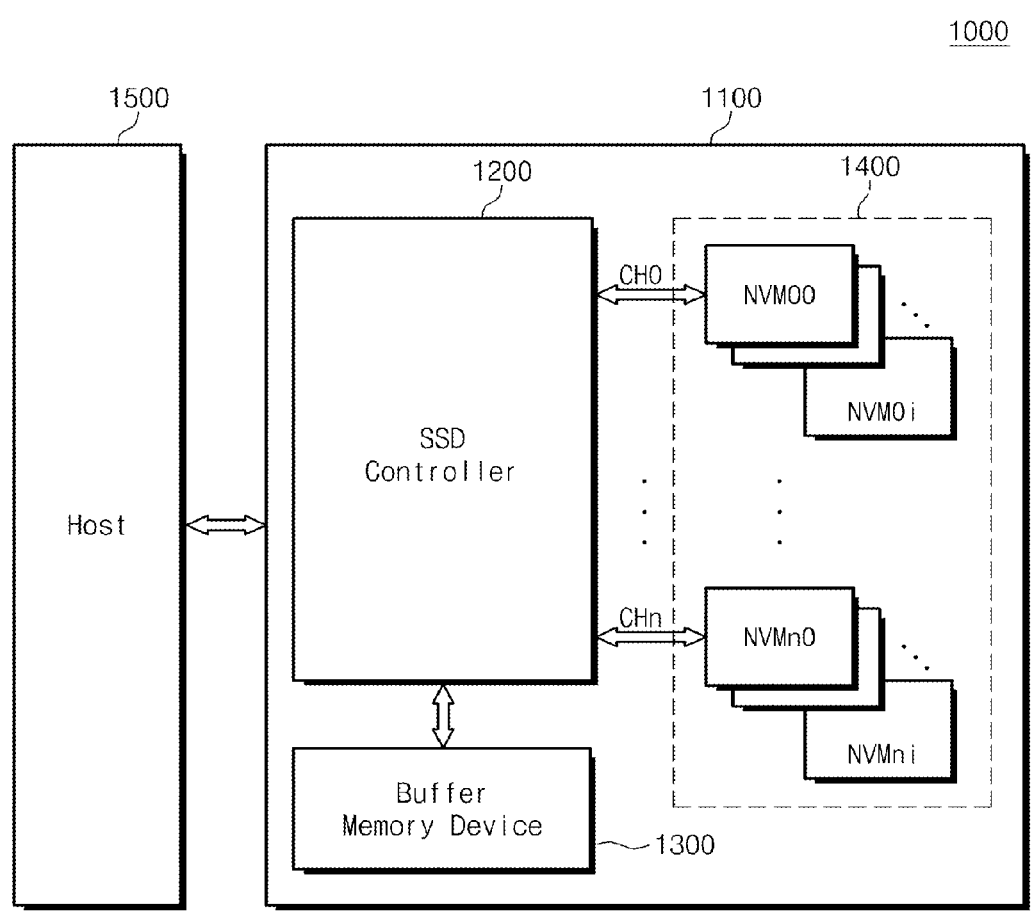
FIG. 11 is a block diagram illustrating a user device including a nonvolatile memory device according to an exemplary embodiment of the inventive concept.

FIG. 11 is a block diagram illustrating a user device including a nonvolatile memory device according to an exemplary embodiment of the inventive concept.

Referring to FIG. 11, a data storage device 1000 may include a solid state driver (SSD) 1100. The SSD 1100 includes an SSD controller 1200, a buffer memory unit 1300, and a storage medium 1400. According to an exemplary embodiment, SSD 1100 may further comprise a temporary power supply circuit including super capacitors. In the event of a sudden loss of power, the temporary power supply circuit may supply power in order to normally terminate operations of SSD 1100.

SSD 1100 operates in response to the access request of a host 1500. That is, in response to the request of host 1500, SSD controller 1200 is configured to access storage medium 1400. For example, SSD controller 1200 is configured to control read/write/erase operations of storage medium 1400. Buffer memory unit 1300 temporarily stores data to be stored in storage medium 1400. Also, buffer memory unit 1300 temporarily stores data read from storage medium 1400. The data stored in buffer memory unit 1300 are transmitted to storage medium 1400 or host 1500 under the control of SSD controller 1200.

SSD controller 1200 is connected to storage medium 1400 through a plurality of channels CH0~CHn. A plurality of nonvolatile memory (NVM) devices NVM00~NVM0*i* are connected to each of the channels CH0~CHn. The NVM devices may share the channel. Storage medium 1400 may include a NAND flash memory device according to an exemplary embodiment of the inventive concept. However, it will be understood that storage medium 1400 is not limited to including a NAND flash memory device. For example, the nonvolatile memory device may include one of nonvolatile memory devices such as NOR flash memory devices, PRAM devices, FRAM devices, and MRAM devices.

Storage medium 1400 of data storage device 1000 according to an exemplary embodiment of the inventive concept performs a programming verification step including a selective verification step and a sequential verification step. Thus, in the subsequent programming verification step, an ON cell current does not flow through a memory cell not requiring a programming verification step (e.g., a memory cell that has a threshold voltage that is less than a threshold voltage for a target programmed state, a memory cell that has reached a target programmed state, or a memory cell that is programmed from a different temporary programmed state). A decrease in the ON cell current causes a decrease in the noise of a common source line CSL that is generated when current flows through the common source line CSL. The use of the storage medium 1400 can improve the reliability of the data storage device 1000.

Figure 12:
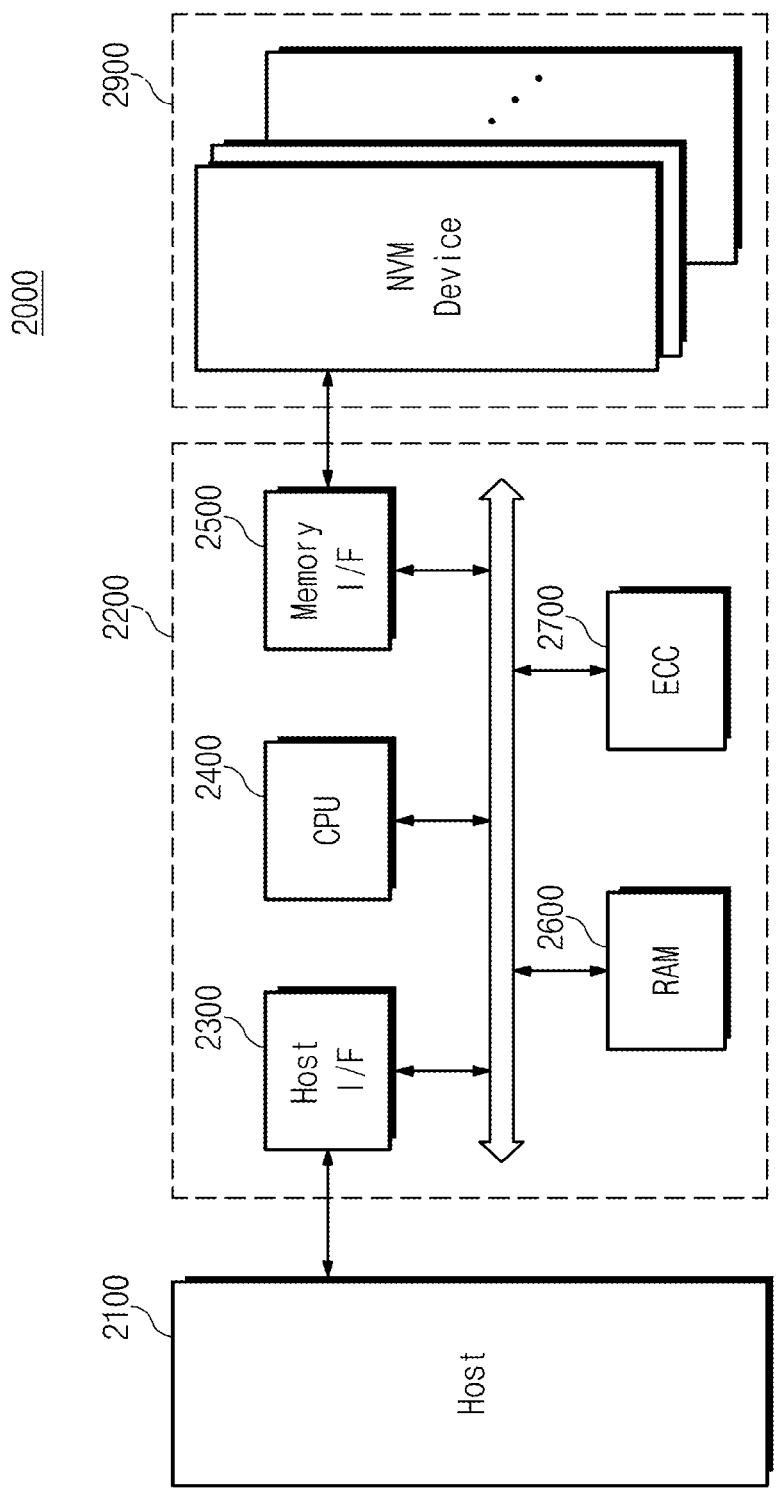
FIG. 12 is a block diagram illustrating another user device including a nonvolatile memory device according to an exemplary embodiment of the inventive concept.

FIG. 12 is a block diagram illustrating another user device including a nonvolatile memory device according to an exemplary embodiment of the inventive concept.

Referring to FIG. 12, a memory system 2000 includes a memory controller 2200 and one or more nonvolatile memory devices 2900. The memory system 2000 may include a plurality of nonvolatile memory devices. According to an exemplary embodiment of the inventive concept, memory system 2000 includes a plurality of nonvolatile memory (NVM) devices 2900.

Memory controller 2200 is connected to host 2100 and nonvolatile memory devices 2900. Memory controller 2200 is configured to access the nonvolatile memory devices 2900 in response to a request from host 2100. For example, memory controller 2200 is configured to control read/write/erase operations of nonvolatile memory devices 2900. Memory controller 2200 is configured to provide an interface between nonvolatile memory devices 2900 and host 2100. Memory controller 2200 is configured to drive firmware for controlling nonvolatile memory devices 2900.

Memory controller 2200 may include a random-access memory (RAM) 2600, a central processing unit (CPU) 2400, a host interface (I/F) 2300, an error correction code (ECC) 2700, and a memory interface 2500. RAM 2600 may be used as a working memory of CPU 2400. CPU 2400 may control an overall operation of memory controller 2200.

Host interface 2300 may include protocol for data exchange between host 2100 and memory controller 2200. For example, memory controller 2200 may be configured to communicate with an external device (e.g., host 2100) through one of various interface protocols such as USB (Universal Serial Bus) protocol, MMC (Multimedia Card) protocol, PCI (Peripheral Component Interconnection) protocol, PCI-E (PCI-Express) protocol, ATA (Advanced Technology Attachment) protocol, SATA (Serial ATA) protocol, ESDI (Enhanced Small Disk Interface) protocol, and IDE (Integrated Drive Electronics) protocol.

ECC 2700 may be configured to detect/correct an error in data read from nonvolatile memory devices 2900. For example, ECC 2700 may be provided as a component of memory controller 2200. As another example, ECC 2700 may be provided as a component of each of the nonvolatile memory devices 2900. Memory interface 2500 may interface nonvolatile memory devices 2900 and memory controller 2200.

It will be understood that memory controller 2200 is not limited to including the above components. For example, memory controller 2200 may further include a read-only memory (ROM) that stores code data necessary for an initial booting operation and data necessary for interfacing with host 2100.

Memory controller 2200 and nonvolatile memory devices 2900 may be integrated into one semiconductor device to constitute a memory card. For example, memory controller 2200 and nonvolatile memory device 2900 may be integrated into one semiconductor device to constitute a memory card such as a PCMCIA (Personal Computer Memory Card International Association) card, a CF (Compact Flash) card, a smart media card, a memory stick, a multimedia card (e.g., MMC, RS-MMC and MMC-micro), a SD (Secure Digital) card (e.g., SD, mini-SD, micro-SD and SDHC), and a UFS (Universal Flash Storage).

As another example, memory controller 2200 and nonvolatile memory devices 2900 may be applicable to solid state drives (SSDs), computers, portable computers, UMPCs (Ultra Mobile Personal Computers), work stations, net-books, PDAs (Personal Digital Assistants), web tablets, wireless phones, mobile phones, digital cameras, digital audio recorders, digital audio players, digital video recorders, digital video players, devices capable of transmitting/receiving information in wireless environments, one of various electronic devices constituting a home network, one of various electronic devices constituting a computer network, one of various electronic devices constituting a telematics network, RFID devices, or embedded systems.

Nonvolatile memory device 2900 or the memory controller 2200 may be mounted in various types of packages. Examples of the packages for nonvolatile memory device 2900 or nonvolatile memory system 2000 include Package on Package (PoP), Ball Grid Arrays (BGAs), Chip Scale Packages (CSPs), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and Wafer-level Processed Stack Package (WSP).

Nonvolatile memory device 2900 of memory system 2000 according to an exemplary embodiment of the inventive concept performs a programming verification step including a selective verification step and a sequential verification step. Thus, in the subsequent programming verification step, an ON cell current does not flow through a memory cell not requiring a programming verification step (e.g., a memory cell that has a threshold voltage lower than a threshold voltage for a target programmed state, a memory cell that has reached a target programmed state, or a memory cell that is programmed from a different temporary programmed state). A decrease in the ON cell current causes a decrease in the noise of a common source line CSL that is generated when current flows through the common source line CSL. The use of nonvolatile memory device 2900 can improve the reliability of memory system 2000.

Figure 13:
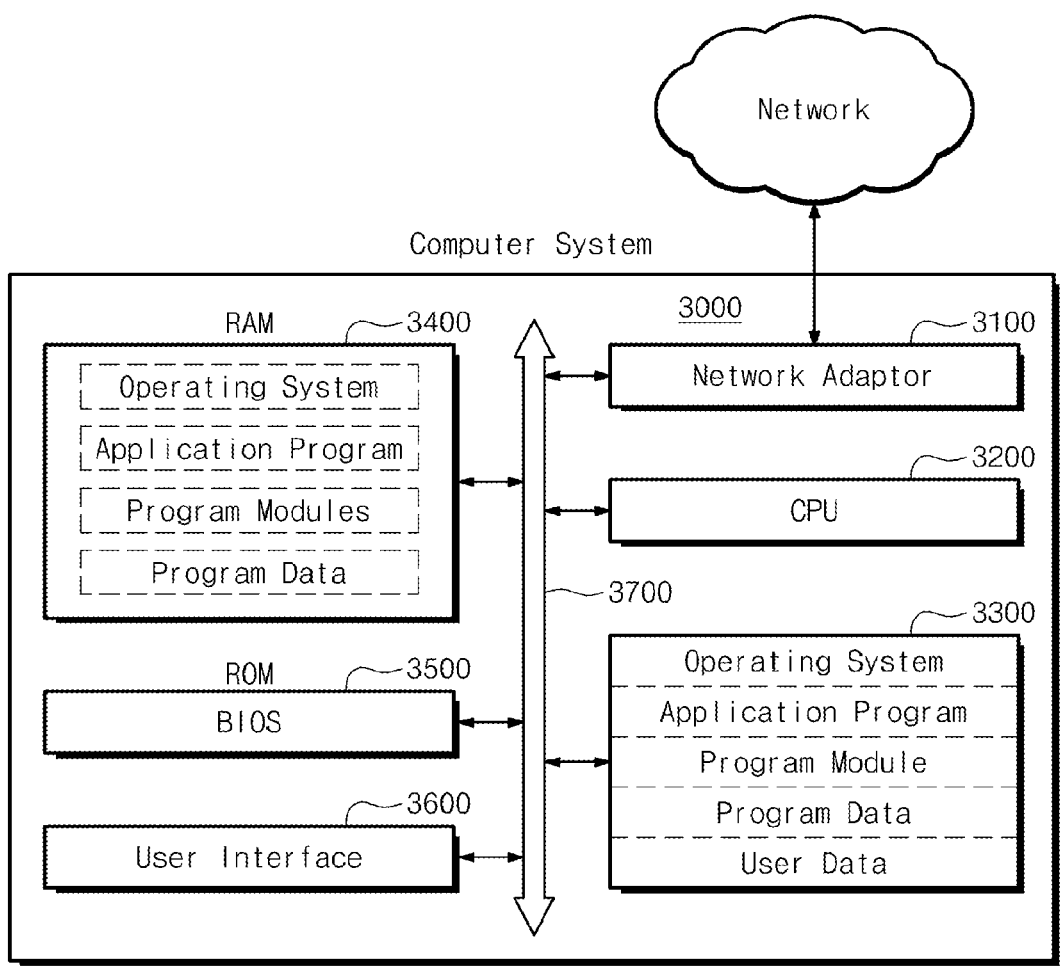
FIG. 13 is a block diagram illustrating a computer system including a data storage device of FIG. 11.

FIG. 13 is a block diagram illustrating a computer system 3000 including the data storage device of FIG. 11 according to an exemplary embodiment of the inventive concept.

Referring to FIG. 13, computer system 3000 includes a network adapter 3100, a central processing unit (CPU) 3200, a data storage device 3300, a random-access memory (RAM) 3400, a read-only memory (ROM) 3500, and a user interface 3600.

Network adapter 3100 provides an interface between computer system 3000 and external networks. CPU 3200 performs an operation process for driving an application program or an operating system residing in RAM 3400. Data storage device 3300 stores necessary data in computer system 3000. For example, data storage device 3300 stores user data, program data, various program modules, application programs, and an operating system for driving computer system 3000.

RAM 3400 may be used as a working memory of computer system 3000. In a booting operation, program data, various program modules, application programs, and an operating system read from data storage device 3300 are loaded into RAM 3400. ROM 3500 stores a Basic Input/Output System (BIOS) that is activated before the driving of an operating system in a booting operation. User interface 3600 is used to perform data exchange between computer system 3000 and a user.

In addition, computer system 3000 may further include a battery and a modem. Although not illustrated in FIG. 13, it will be understood that the memory system according to the inventive concept may further include an application chipset, a camera image processor (CIS), and a mobile DRAM.

As described above, the nonvolatile memory device according to the inventive concept can reduce the noise voltage of a common source line in a programming step, thereby making it possible to reduce an increase in the threshold voltage distribution of a memory cell.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A method of programming a plurality of memory cells of a nonvolatile memory device to a plurality of target programmed states, the method comprising:
    performing a programming of at least some of the memory cells by applying a programming voltage;
    performing a selective verification for selecting memory cells to be programmed to a subset of the target programmed states, the subset being less than all of the target programmed states; and
    performing a sequential verification for determining programmed states of the selected memory cells by precharging bit lines of the selected memory cells.

2. The method of claim 1, wherein the selective verification is performed before the sequential verification.

3. The method of claim 1, wherein in the performing of the selective verification, the bit lines of the memory cells to be programmed to the subset of the target programmed states are selectively precharged.

4. The method of claim 3, wherein programming verification results of the precharged memory cells are determined according to the respective programmed states thereof.

5. The method of claim 3, wherein non-precharged memory cells are determined to be program-failed.

6. The method of claim 1, wherein the sequential verification is performed for each of the subset of the target programmed states.

7. The method of claim 6, wherein the sequential verification selectively precharges the memory cells according to a programming verification result of the selective verification or a previous sequential verification.

8. The method of claim 6, wherein in the sequential verification, a memory cell determined to be program-passed is selectively precharged.

9. The method of claim 6, wherein in the sequential verification, a ground voltage is applied to the bit line of a memory cell determined to be program-failed.

10. The method of claim 1, wherein a sequential verification voltage applied in the performing of the sequential verification is greater than a selective verification voltage applied in the performing of the selective verification.

11. The method of claim 10, wherein the programming voltage applied in the programming is greater than the sequential verification voltage.

12. The method of claim 1, wherein the programming, the selective verification, and the sequential verification constitute a program loop, and wherein the program loop is repeated a fixed number of times.

13. The method of claim 12, wherein the programming voltage applied in the programming increases by a fixed increment from each program loop to a subsequent program loop.

14. The method of claim 1, wherein the target programmed states include an erase state and a plurality of programmed states.

15. The method of claim 14, wherein the programmed states are determined according to a number of data bits storable in the plurality of memory cells.

16. For a nonvolatile memory device having a plurality of word lines, a plurality of bit lines, and a plurality memory cells each of which is connected to one of the word lines and one of the bit lines, wherein the memory cells are programmable to a plurality of target programmed states, a method comprising:
    supplying a programming voltage to a first one of the word lines having a set of the memory cells connected thereto;
    verifying a programmed state of the set of memory cells that are connected to the word line to which the programming voltage was applied, wherein the verifying comprises:
        performing a first selective verification for only selected memory cells, among the set of memory cells, which are to be programmed to a first subset of the target programmed states; and
        performing a sequential verification of only the selected memory cells for the subset of target programming states.

17. The method of claim 16, wherein the sequential verification comprises:
    performing a separate first sequential verification sub-step for each of the target programming states in the subset, wherein each sequential verification sub-step is only performed on those memory cells among the selected memory cells that have not been determined to be program-failed in a previous sequential verification sub-step.

18. The method of claim 16, verifying a programmed state of the set of memory cells that are connected to the word line to which the programming voltage was applied further comprises:
    performing a second selective verification for only second selected memory cells, among the set of memory cells, which are to be programmed to a second subset of the target programmed states; and
    performing a second sequential verification of only the second selected memory cells for the second subset of target programming states.

19. The method of claim 18, wherein the second sequential verification comprises:
    performing a separate second sequential verification sub-step for each of the target programming states in the second subset, wherein each second sequential verification sub-step is only performed on those memory cells among the second selected memory cells that have not been determined to be program-failed in a previous second sequential verification sub-step.

20. The method of claim 16, wherein supplying the programming voltage and verifying the programmed state comprise a program loop, and wherein the method comprises repeating the program loop a fixed number of times.

* * * * *